(12) United States Patent
Akiyama et al.

(10) Patent No.: US 8,160,116 B2
(45) Date of Patent: Apr. 17, 2012

(54) SEMICONDUCTOR LASER AND METHOD FOR MANUFACTURING THE SAME

(75) Inventors: Tomoyuki Akiyama, Tokyo (JP); Mitsuru Sugawara, Tokyo (JP)

(73) Assignee: QD Laser Inc., Tokyo (JP)

( * ) Notice: Subject to any disclaimer, the term of this patent is extended or adjusted under 35 U.S.C. 154(b) by 0 days.

(21) Appl. No.: 12/667,763

(22) PCT Filed: Jun. 9, 2008

(86) PCT No.: PCT/JP2008/060517
§ 371 (c)(1),
(2), (4) Date: Jan. 5, 2010

(87) PCT Pub. No.: WO2009/011184
PCT Pub. Date: Jan. 22, 2009

(65) Prior Publication Data
US 2010/0195688 A1    Aug. 5, 2010

(30) Foreign Application Priority Data
Jul. 17, 2007    (JP) .................................. 2007-186352

(51) Int. Cl.
*H01S 5/00* (2006.01)
(52) U.S. Cl. ................ 372/45.01; 372/45.012
(58) Field of Classification Search ............... 372/45.01, 372/45.012
See application file for complete search history.

(56) References Cited

U.S. PATENT DOCUMENTS
| | | | |
|---|---|---|---|
| 5,608,229 A | 3/1997 | Mukai | |
| 5,982,804 A * | 11/1999 | Chen et al. | 372/96 |
| 2005/0030997 A1 * | 2/2005 | Tanaka et al. | 372/46 |
| 2005/0045868 A1 * | 3/2005 | Otsubo et al. | 257/14 |
| 2006/0222028 A1 * | 10/2006 | Hatori et al. | 372/45.01 |

FOREIGN PATENT DOCUMENTS
| | | | |
|---|---|---|---|
| JP | 11-54837 | | 2/1999 |
| JP | 11-346033 | | 12/1999 |
| JP | 11346033 | A * | 12/1999 |
| JP | 2003-60302 | A1 | 2/2003 |
| JP | 3468866 | A1 | 9/2003 |
| JP | 2006-148065 | A1 | 6/2006 |
| JP | 2006-286902 | A1 | 10/2006 |
| JP | 2007-73582 | A1 | 3/2007 |

OTHER PUBLICATIONS

International Search Report for International Application No. PCT/JP2008/060517 dated Jun. 18, 2008.
Office Action dated Dec. 8, 2010 issued in the corresponding Chinese Patent Application No. 200880024944.5 with English translation.
Chinese Office Action dated Aug. 10, 2011, in counterpart Chinese Application No. 200880024944.5, with English Translation.

* cited by examiner

*Primary Examiner* — Patrick Stafford
(74) *Attorney, Agent, or Firm* — Kratz, Quintos & Hanson, LLP

(57) ABSTRACT

The present invention provides a semiconductor laser including a first conductive type of a lower clad layer 12, an active layer 14 provided on the lower clad layer 12, the active layer 14 including a plurality of quantum dots, and a second conductive type of an upper clad layer 18, the upper clad layer 18 being provided on the active layer 14 so as to have an isolated ridge portion 30 such that $W1 \leq W_{top} + 0.4$ μm where $W_{top}$ is the width of a top of the ridge portion 30 and $W1$ is the width of the ridge portion 30 at a height of 50 nm from a bottom of the ridge portion 30. The present invention also provides a method for manufacturing such a semiconductor laser.

8 Claims, 13 Drawing Sheets

Fig. 1A  PRIOR ART
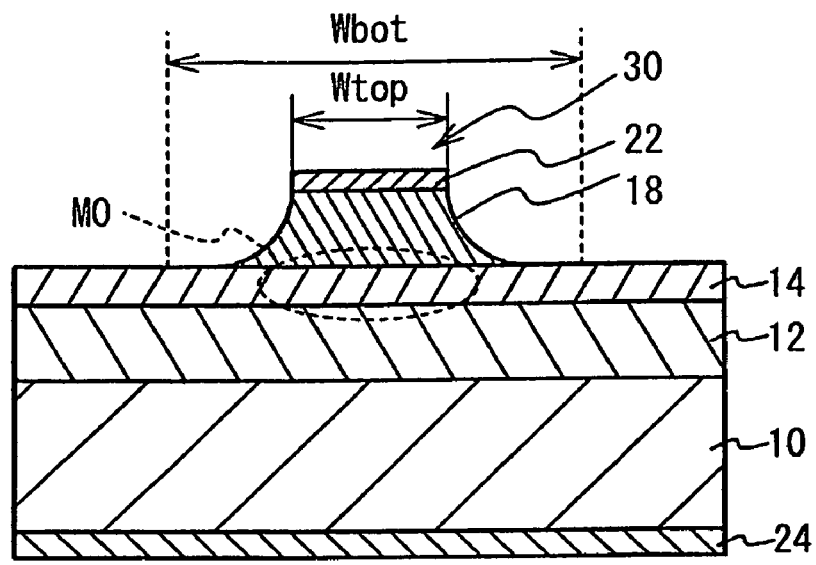
PRIOR ART
Fig. 1B
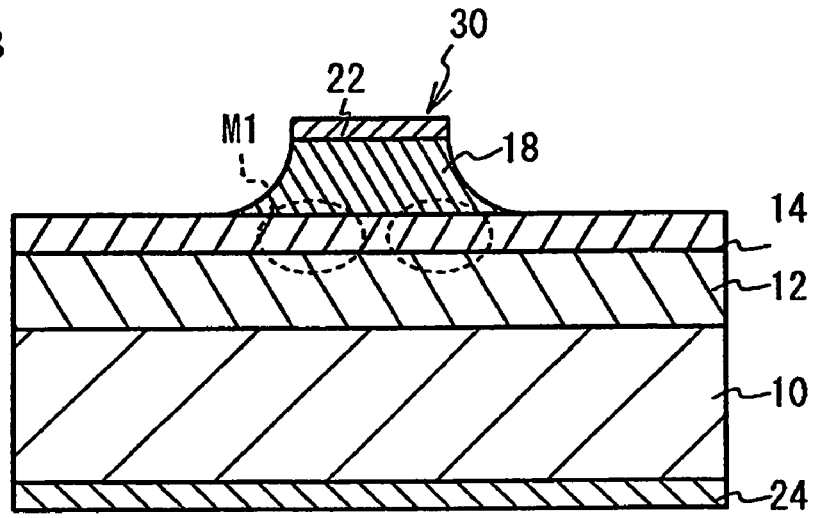

SEMICONDUCTOR LASER AND METHOD FOR MANUFACTURING THE SAME

FIELD

The present invention relates to a semiconductor laser and a method for manufacturing the same, and more particularly to a semiconductor laser having a plurality of quantum dots as an active layer and a method for manufacturing the same.

BACKGROUND

Semiconductor lasers used for an active layer having quantum dots have been developed in recent years. Patent Document 1 discloses a method for forming quantum dots. Patent Document 2 discloses a semiconductor laser in which at least part of an active layer including a plurality of quantum dots is formed of p-type semiconductor in order to achieve high-speed modulation and high reliability.

Referring to FIG. 1E of Patent Document 2, a p-type clad layer 2 and a quantum dot active layer 3 are stacked on a p-type GaAs substrate 1. An n-type clad layer 4 having a convex shape (ridge portion) is provided on the quantum dot active layer 3. The n-type clad layer 4 is formed only at a central portion of the quantum dot active layer 3. Thus, an area of p-n junction formed by the quantum dot active layer 3 and the n-type clad layer 4 can be reduced. Therefore, the parasitic capacitance can be reduced, so that high-speed modulation can be achieved.

Patent Document 1: Japanese patent No. 3468866
Patent Document 2: Japanese laid-open patent publication No. 2006-286902

SUMMARY

Technical Problem

As described at paragraph 0025 of Patent Document 2, the convex shape (ridge portion) of Patent Document 2 is formed by wet etching. FIGS. 1A to 2B show examples of cases where a ridge portion is formed by wet etching, and are cross-sectional views taken perpendicular to a direction of light propagation. Referring to FIGS. 1A to 2B, a p-type clad layer 12 as a lower clad layer, a quantum dot active layer 14, and an n-type clad layer 18 as an upper clad layer are formed on a p-type substrate 10. The n-type clad layer 18 has a ridge portion 30. An n-electrode 22 is provided on an upper surface of the ridge portion 30, and a p-electrode 24 is provided below the substrate 10.

Since the ridge portion 30 of the n-type clad layer 18 is formed by wet etching, it has a trapezoidal shape. Specifically, as shown in FIG. 1A, the width Wbot of a bottom of the ridge portion 30 is greater than the width Wtop of a top of the ridge portion 30. When laser oscillation is carried out with such a structure, a guided mode of the fundamental mode M0 is generated in the quantum dot active layer 14 located below the ridge portion 30 as shown in FIG. 1A. However, as shown in FIG. 1B, a guided mode of the first higher mode M1 is also formed in the quantum dot active layer 14 located below the ridge portion 30. Because the quantum dot active layer 14 located below the ridge portion 30 and its vicinity are a waveguide region of oscillated light, light having a wavelength of the first higher mode M1 is mixed into the oscillated light if the first higher mode M1 is formed in the quantum dot active layer 14 located below the ridge portion 30. The reason why the first higher mode M1 is thus formed below the ridge portion 30 is because the width Wbot is large.

FIGS. 2A and 2B show a case where the width Wbot of the bottom of the ridge portion 30 is reduced. As shown in FIG. 2A, the fundamental mode M0 is formed in the quantum dot active layer 14 located below the ridge portion 30. As shown in FIG. 2B, the first higher mode M1 is formed in the quantum dot active layer 14 at both sides of a portion located below the ridge portion 30. Therefore, the first higher mode M1 can be prevented from being mixed into oscillated light. However, as the width Wbot is reduced, the width Wtop of the top of the ridge portion 30 is also reduced. The n-electrode 22 is formed on the upper surface of the ridge portion 30. If the width Wtop is reduced, a contact resistance between the n-type clad layer 18 and the n-electrode 22 is increased so as to inhibit high-speed modulation.

The present invention has been made in view of the above problems. It is, therefore, an object of the present invention to prevent higher modes from being mixed into oscillated light in a quantum dot semiconductor laser and reduce a contact resistance between an upper clad layer and an electrode.

Solution to Problem

The present invention provides a semiconductor laser characterized by comprising: a first conductive type of a lower clad layer; an active layer provided on the lower clad layer, the active layer including a plurality of quantum dots; a second conductive type of an upper clad layer that is opposite to the first conductive type, the upper clad layer being provided on the active layer so as to have an isolated ridge portion such that $W1 \leq Wtop+0.4$ μm where Wtop is a width of a top of the ridge portion and W1 is a width of the ridge portion at a height of 50 nm from a bottom of the ridge portion; and an electrode provided on the upper clad layer. According to the present invention, higher modes can be prevented from being mixed into oscillated light, and a contact resistance between the upper clad layer and the electrode can be reduced.

In the above arrangement, the upper clad layer may include a first layer and a second layer provided on the first layer, and the first layer may have a minimum width of the ridge portion. With this arrangement, higher modes can more effectively be prevented from being mixed into oscillated light.

In the above arrangement, the semiconductor laser may be configured such that the first layer and the second layer comprise an AlGaAs layer and that an Al compositional ratio of the first layer is higher than that of the second layer. With this arrangement, a structure in which the first layer has a minimum width of the ridge portion can readily be produced.

In the above arrangement, the semiconductor laser may be configured to have a third layer provided on the second layer, the third layer having a concentration of the second conductive type of carriers that is higher than those of the first layer and the second layer. With this arrangement, a contact resistance of contact with the upper clad layer can more effectively be reduced.

In the above arrangement, the semiconductor laser may be configured such that the plurality of quantum dots is formed of InGaAs or InAs and that the active layer includes a barrier layer of AlGaAs or GaAs that surrounds the plurality of quantum dots.

In the above arrangement, the semiconductor laser may be configured such that the first conductive type is p-type, that the second conductive type is n-type, and that the barrier layer has a p-type layer.

In the above arrangement, the semiconductor laser may be configured to have an undoped layer between the active layer and the upper clad layer. With this arrangement, p-n junction adjacent to the ridge portion can be removed without etching the active layer when the ridge portion is formed.

The present invention provides a method for manufacturing a semiconductor laser, the method comprising: a step of sequentially stacking, on a first conductive type of a lower clad layer, an active layer including a plurality of quantum dots, a first layer included in a second conductive type of an upper clad layer that is opposite to the first conductive type, and a second layer included in the upper clad layer; a step of dry-etching the second layer and wet-etching the first layer so as to form the upper clad layer into an isolated ridge portion on the active layer; and a step of forming an electrode on the upper clad layer. According to the present invention, since the second layer is dry-etched, a side surface of the upper clad layer can be made steep. Therefore, higher modes are prevented from being mixed into oscillated light, and a contact resistance between the upper clad layer and the electrode can be reduced. Furthermore, since the first layer is wet-etched, the active layer is prevented from being over-etched.

In the above arrangement, the method may be configured such that the first layer and the second layer comprise an AlGaAs layer and that an Al compositional ratio of the first layer is higher than that of the second layer. With this arrangement, an etching rate of wet etching of the first layer can be made higher than that of the second layer. Thus, the side surface of the ridge portion can be made steeper.

In the above arrangement, the method may be configured such that the minimum width of the ridge portion located in the first AlGaAs layer is smaller than the width of the top of the ridge portion. With this arrangement, higher modes can more effectively be prevented from being mixed into oscillated light.

Advantageous Effects of Invention

According to the present invention, higher modes can be prevented from being mixed into oscillated light, and a contact resistance between an upper clad layer and an electrode can be reduced.

BRIEF DESCRIPTION OF THE DRAWINGS

FIGS. 1A and 1B are cross-sectional views showing an example (first example) of a quantum dot semiconductor laser in which a ridge portion is formed by wet etching.

DESCRIPTION OF EMBODIMENTS

The principle of the present invention will be described with reference to FIGS. 3A and 3B. A ridge portion 30 has a cross-section having a rectangular shape. Specifically, the width Wtop of a top of the ridge portion 30 is almost the same as the width Wbot of a bottom of the ridge portion 30. Other structures are the same as those of FIGS. 1A to 2B. As shown in FIG. 3A, the fundamental mode M0 is formed in a quantum dot active layer 14 located below the ridge portion 30. As shown in FIG. 3B, the first higher mode M1 is formed in the quantum dot active layer 14 at both sides of a portion located below the ridge portion 30. Furthermore, in FIG. 3A, the width Wtop can be increased as compared to FIG. 2A. Therefore, a contact resistance between an n-type clad layer 18 and an n-electrode 22 can be reduced.

Thus, the width Wtop of the top of the ridge portion 30 is set to be equal to or greater than the width Wbot of the bottom of the ridge portion 30. This configuration can suppress mixture of higher modes and enables high-speed modulation.

For example, when the ridge portion 30 shown in FIG. 3A is formed by dry etching, the ridge portion 30 can have a side wall close to the perpendicular. However, damages are formed on the quantum dot active layer 14. In this manner, the ridge portion 30 having a shape as shown in FIG. 3A is not readily formed. Examples for facilitating formation of the ridge portion 30 will be described below. In the following description, a first conductive type is p-type, and a second conductive type opposite to the first conductive type is n-type. However, the first conductive type may be n-type, and the second conductive type may be p-type. Specifically, the semiconductor substrate may be of n-type, the lower clad layer may be of n-type, and the upper clad layer may be of p-type.

EXAMPLE 1

Figure 4A:
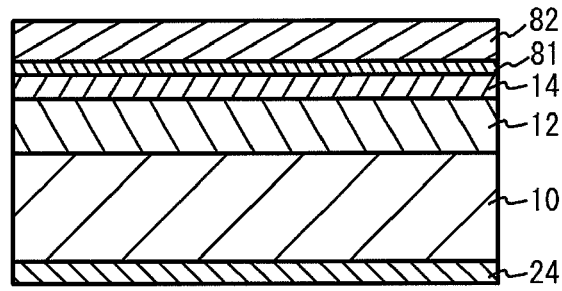
FIGS. 4A to 4D are cross-sectional views showing a process of manufacturing a semiconductor laser according to Example 1.

FIGS. 4A to 4D are cross-sectional views showing a process of manufacturing a semiconductor laser according to Example 1. Referring to FIG. 4A, a p-type clad layer 12 (lower clad layer), a quantum dot active layer 14 having a plurality of quantum dots, and an n-type clad layer 18 (upper clad layer) are sequentially stacked and formed on a p-type semiconductor substrate 10 by using, for example, an MBE (Molecular Beam Epitaxy) method. The n-type clad layer 18 includes a first layer 81 and a second layer 82.

Figure 4B:
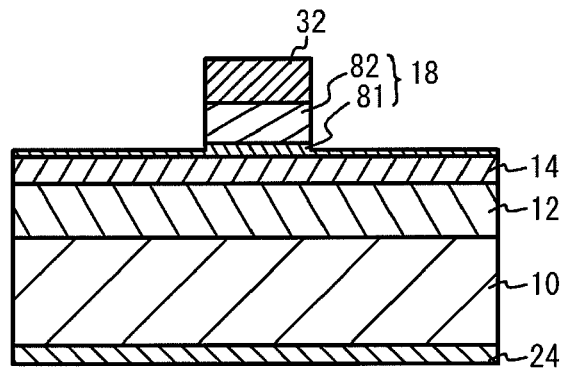

Referring to FIG. 4B, a photoresist 32 is formed on the n-type clad layer 18. While the photoresist 32 is used as a mask, the n-type clad layer 18 is subjected to anisotropic etching that reaches the first layer 81 by a dry etching method. At that time, a side surface of the n-type clad layer 18 becomes almost perpendicular.

Figure 4C:
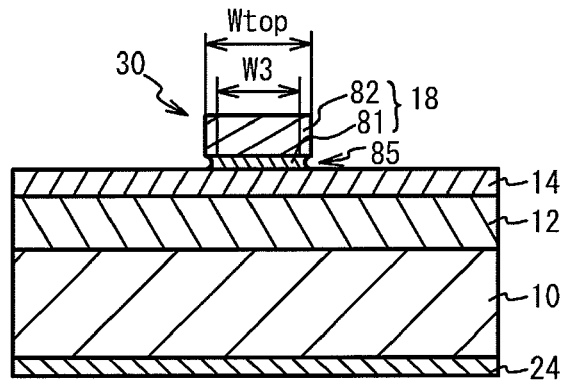

Referring to FIG. 4C, the first layer 81 of the n-type clad layer 18 is etched by using wet etching. At that time, materials of the respective layers and an etchant are selected such that an etching rate of the first layer 81 is higher than those of the quantum dot active layer 14 and the second layer 82. Thus, the first layer 81 and the side surface are etched, so that a ridge portion 30 is formed. In this manner, the n-type clad layer 18 having the ridge portion 30 is formed on the quantum dot active layer 14. The etching rate of the first layer 81 is so high that a constriction 85 of the ridge portion 30 is formed on the first layer 81. The photoresist 32 is then removed.

Figure 4D:
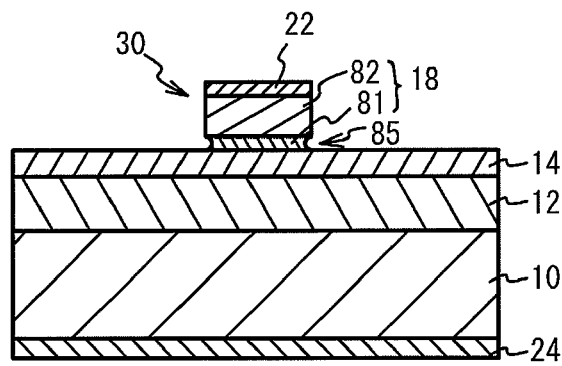

Referring to FIG. 4D, an n-electrode 22 is formed above the n-type clad layer 18, and a p-electrode 24 is formed below the p-type substrate 10. Thus, a semiconductor laser according to Example 1 is completed.

According to Example 1, the n-type clad layer 18 is formed into an isolated ridge portion 30 on the quantum dot active layer 14 by dry-etching the second layer 82 as shown in FIG. 4B and wet-etching the first layer 81 as shown in FIG. 4C. With such a process, since the second layer 82 is dry-etched, the side surface of the n-type clad layer 18 can be made steep. Therefore, higher modes are prevented from being mixed into oscillated light, and a contact resistance between the n-type clad layer 18 and the n-electrode 22 can be reduced. Furthermore, since the first layer 81 is wet-etched, the quantum dot active layer 14 is prevented from being over-etched.

In an example in which an etching rate of the first layer 81 is set to be higher than those of the quantum dot active layer 14 and the second layer 82 as shown in FIG. 4C, the n-type clad layer 18 is formed of, for example, an AlGaAs layer, and the Al compositional ratio of the first layer 81 is set to be higher than that of the second layer 82. An AlGaAs layer has a higher rate of wet etching as it has a higher Al compositional ratio. For example, the first layer 81 is wet-etched with a hydrofluoric acid solution, so that the first layer 81 can be etched selectively with respect to the second layer 82. Thus, the first layer 81 can have a minimum width of the ridge portion 30

Furthermore, it has been known that an etching rate of wet etching of an AlGaAs layer drastically increases if an Al compositional ratio exceeds 0.4. Therefore, it is preferable to adjust an Al compositional ratio of the first layer 81 to be at least 0.4 and to adjust an Al compositional ratio of the second layer 82 to be lower than 0.4. Moreover, it is preferable to adjust the film thickness of the first layer 81 to be equal to or smaller than 0.3 μm in order to reduce a resistance between the quantum dot active layer 14 and the second layer 82.

Figure 2A:
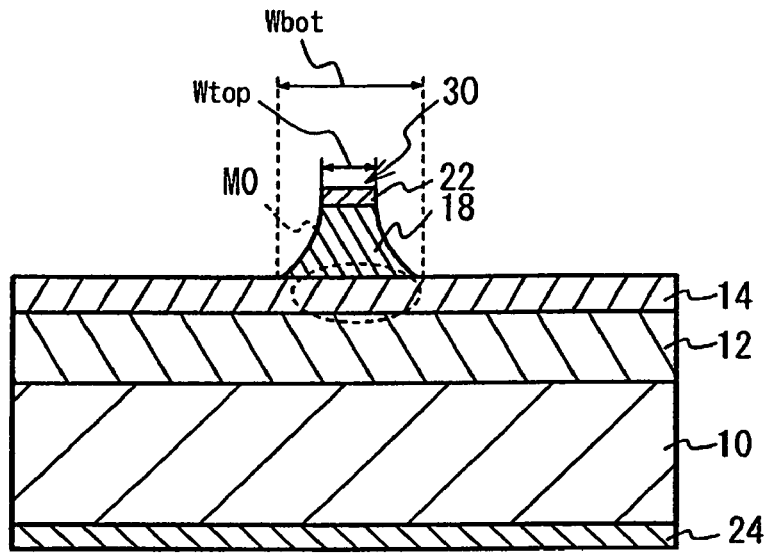
FIGS. 2A and 2B are cross-sectional views showing an example (second example) of a quantum dot semiconductor laser in which a ridge portion is formed by wet etching.
Figure 2B:
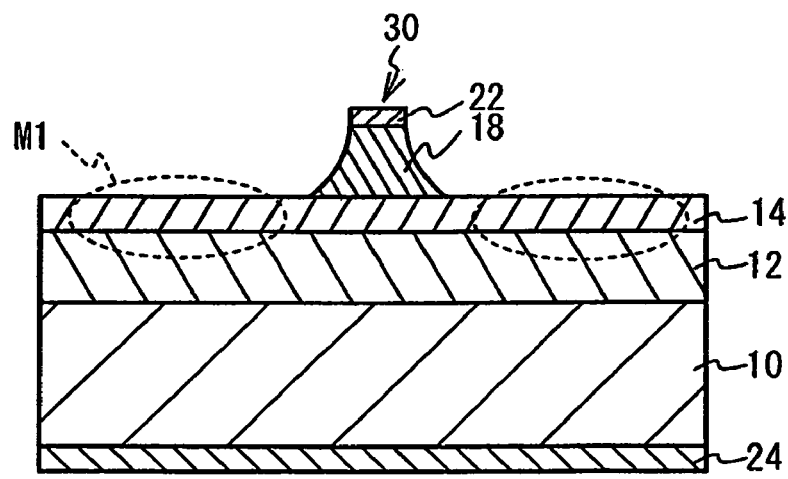
Figure 3A:
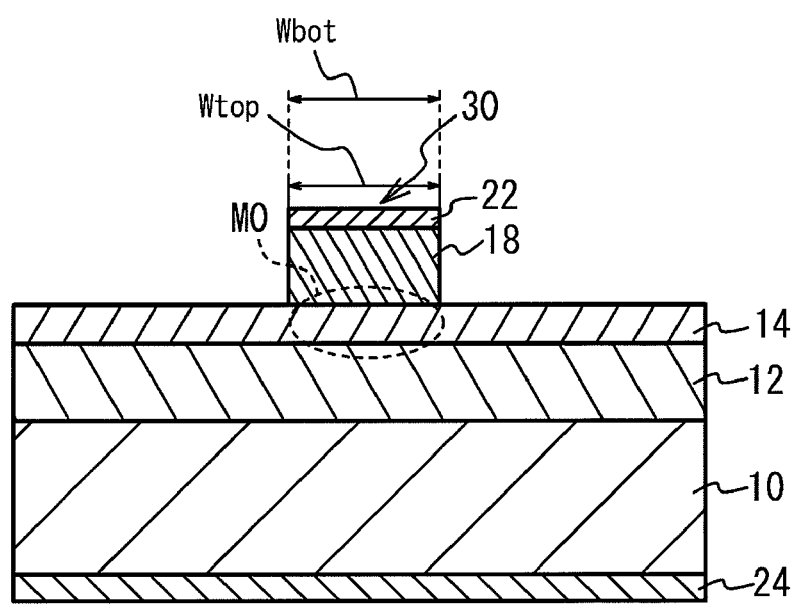
FIGS. 3A and 3B are cross-sectional views showing an example (third example) of a quantum dot semiconductor laser in which a ridge portion is formed by dry etching.
Figure 3B:
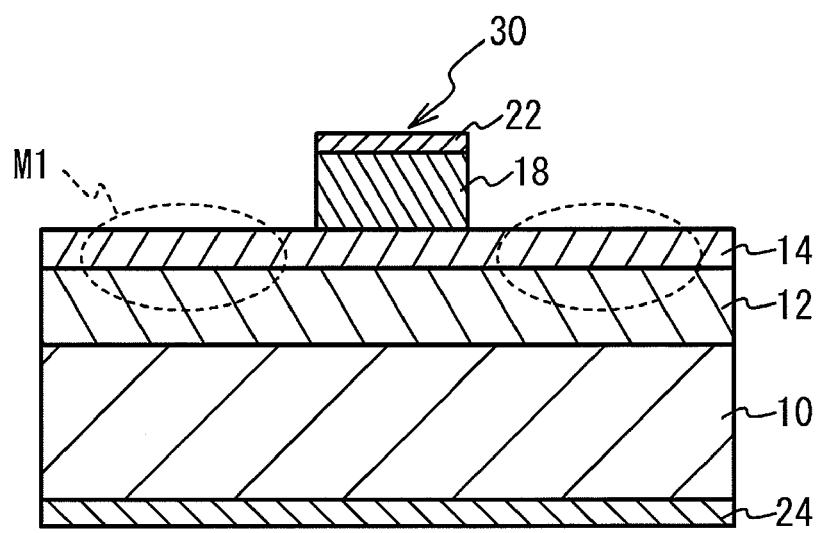

Guided modes were simulated in Example 1 and an example (Comparative Example 1) in which the ridge portion 30 was formed by wet etching as shown in FIGS. 1A and 2A.

Figure 5:
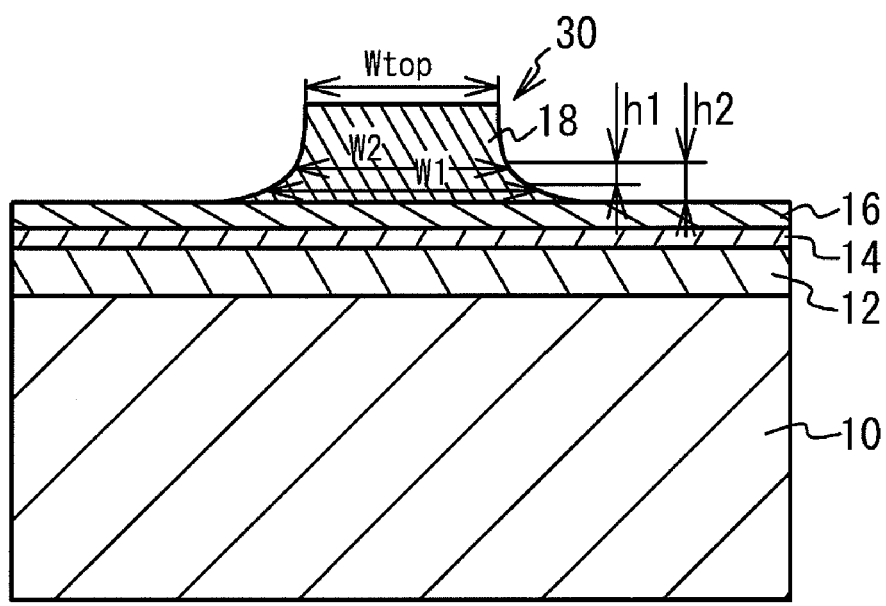
FIG. 5 is a diagram showing a cross-section of a semiconductor laser used for simulation of Comparative Example 1.

FIG. 5 is a diagram showing a cross-section of a semiconductor laser used for the simulation of Comparative Example 1. A p-type clad layer 12 of p-type $Al_{0.35}Ga_{0.65}As$ having a film thickness of 1400 nm, a GaAs quantum dot active layer 14 including a p-type layer having a film thickness of 500 nm, a spacer layer 16 of undoped GaAs having a film thickness of 50 nm, and an n-type clad layer 18 of n-type $Al_{0.35}Ga_{0.65}As$ having a film thickness of 1200 nm, which formed a ridge portion 30, were provided on a p-type GaAs substrate 10. The ridge portion 30 was formed such that W1=Wtop+1.2 μm and W2=Wtop+0.8 μm where Wtop was the width of the top of the ridge portion 30, W1 was the width of the ridge portion 30 at a height h1 that was 20 nm from the bottom of the ridge portion 30, and W2 was the width of the ridge portion 30 at a height h2 that was 50 nm from the bottom of the ridge portion 30.

Figure 6:
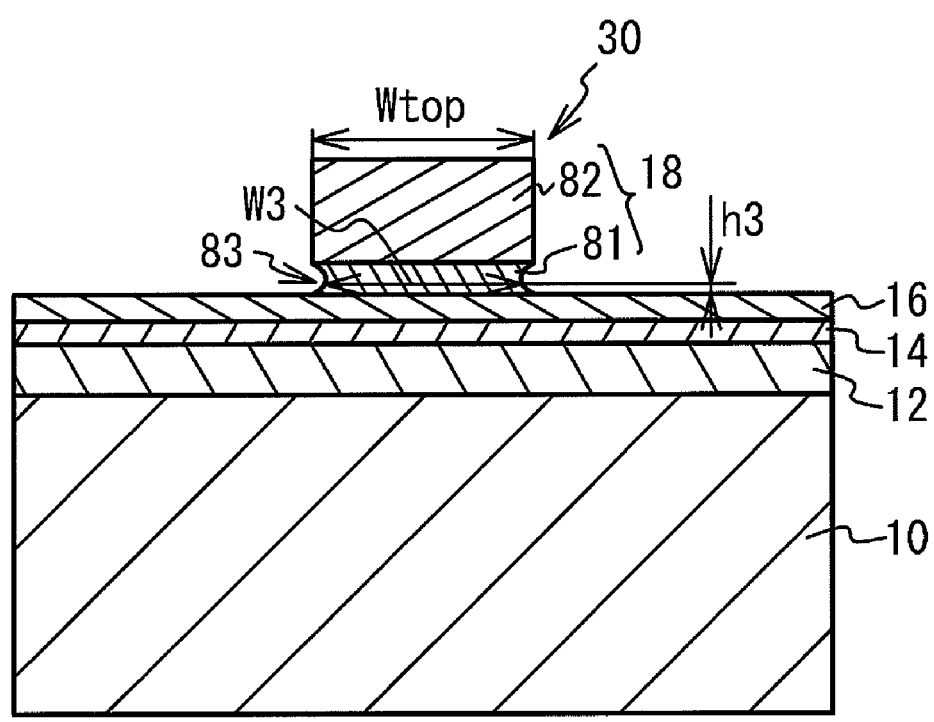
FIG. 6 is a diagram showing a cross-section of a semiconductor laser used for simulation of Example 1.

FIG. 6 is a diagram showing a cross-section of a semiconductor laser used for the simulation of Example 1. An n-type clad layer 18 was formed by a first layer 81 of $Al_{0.45}Ga_{0.55}As$ having a film thickness of 200 nm and a second layer 82 of $Al_{0.35}Ga_{0.65}As$ having a film thickness of 1400 nm. A side surface of the second layer 82 became almost perpendicular, and a constriction 85 was formed on the first layer 81. A ridge portion 30 was formed such that W3=Wtop−0.25 μm where W3 was the width of the ridge portion 30 at a height h3 that was 100 nm from the bottom of the ridge portion 30.

Figure 7A:
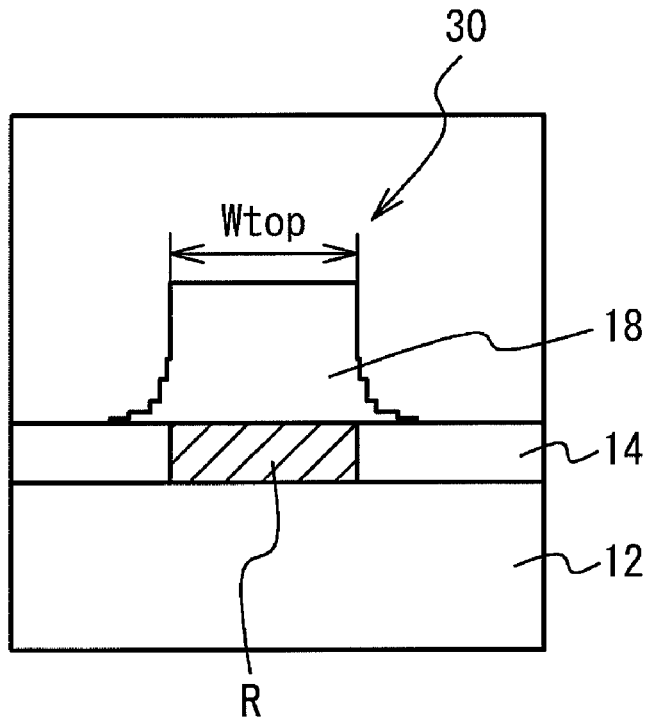
FIGS. 7A and 7B are diagrams showing simulated structures of Comparative Example 1 and Example 1.
Figure 7B:
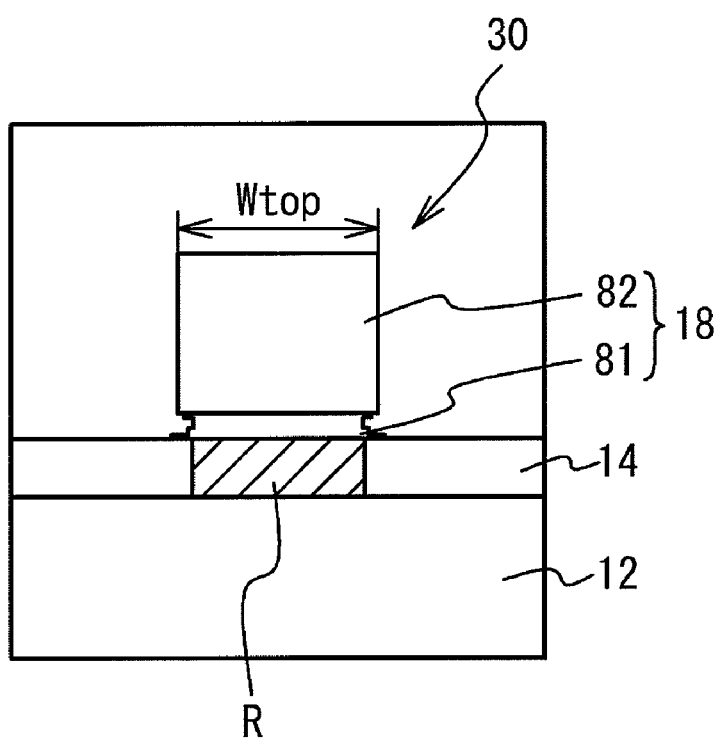

FIGS. 7A and 7B are diagrams showing simulated structures of Comparative Example 1 and Example 1, respectively. Optical confinement factors Γ0 and Γ1 of the fundamental mode M0 and the first higher mode M1 were respectively defined by values into which the intensity of light in regions R (the quantum dot active layer 14 located below the ridge portion 30) of FIGS. 7A and 7B was normalized by the all-optical intensity of each mode.

Figure 8:
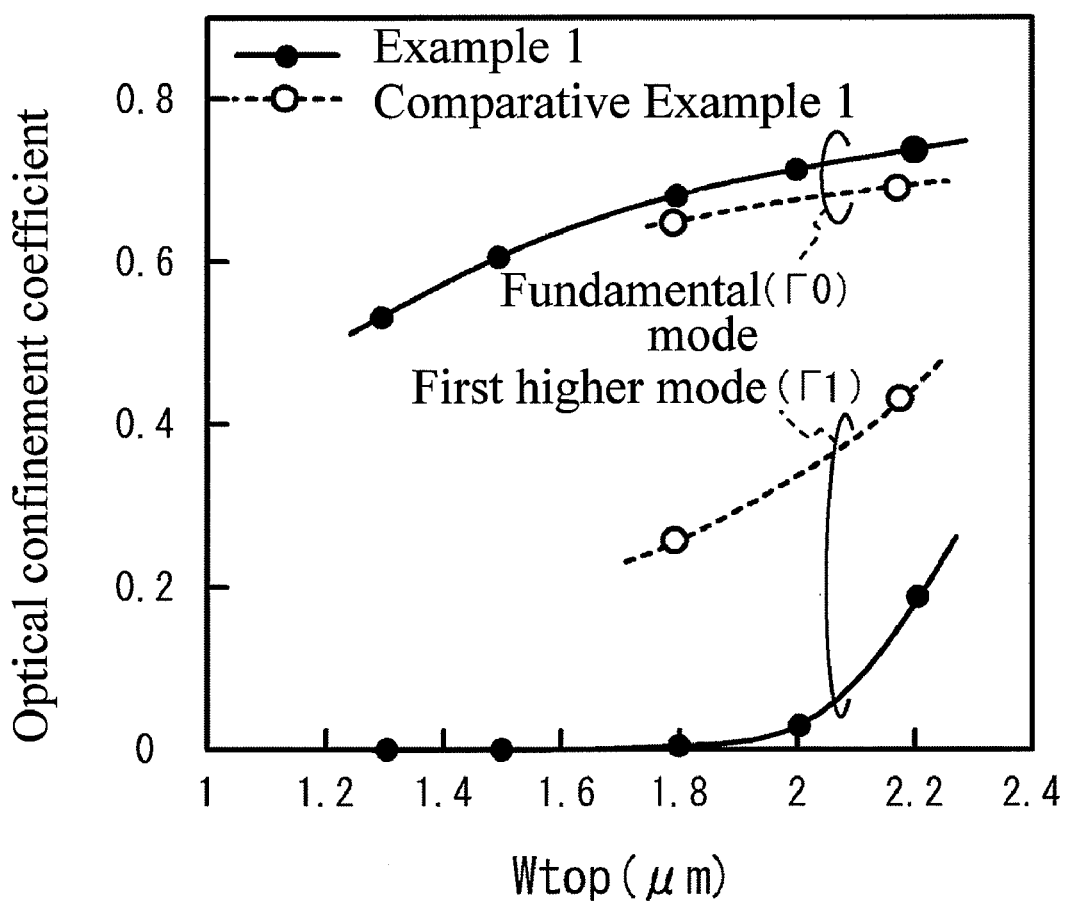
FIG. 8 is simulation results showing optical confinement factors $\Gamma 0$ and $\Gamma 1$ of the semiconductor lasers according to Comparative Example 1 and Example 1 with respect to Wtop.

FIG. 8 is the simulation results showing the optical confinement factors Γ0 and Γ1 of the semiconductor lasers according to Comparative Example 1 and Example 1 with respect to Wtop. The open circles represent the simulation result of Comparative Example 1, whereas the filled circles represent the simulation result of Example 1. The dashed lines and the solid lines are approximation lines connecting the simulation results of Comparative Example 1 and Example 1, respectively. In Comparative Example 1, the optical confinement factor Γ1 of the first higher mode M1 ranged from 0.2 to 0.4. In Example 1, however, the optical confinement factor Γ1 was not higher than 0.2. Particularly, Γ1 was almost zero when Wtop was equal to or less than 2.0 μm. Furthermore, Γ1 was almost zero when Wtop was equal to or less than 1.8 μm. Thus, in Example 1, Γ1 could be made almost zero by optimizing Wtop. Furthermore, the optical confinement factor Γ0 of the fundamental mode M0 in Example 1 was also higher than that in Comparative Example 1. Accordingly, in Example 1, higher modes in the region R could be suppressed, and the intensity of the fundamental mode in the region R could be increased.

As described above, when the width Wtop of the top of the ridge portion 30 is set to be equal to or greater than the width Wbot of the bottom of the ridge portion 30, higher modes can be prevented from being mixed into oscillated light. Therefore, the intensity of the fundamental mode in the region R can be increased. Furthermore, since Wtop can be increased in a state in which higher modes are prevented from being mixed into oscillated light, a contact resistance between the n-type clad layer 18 and the n-electrode 22 can be reduced.

EXAMPLE 2

Example 2 is an example that can suppress higher modes and increase the intensity of the fundamental mode in the region R, as with Example 1, in a case where the width Wtop of the top of the ridge portion 30 was smaller than the width Wbot of the bottom of the ridge portion 30.

Figure 9:
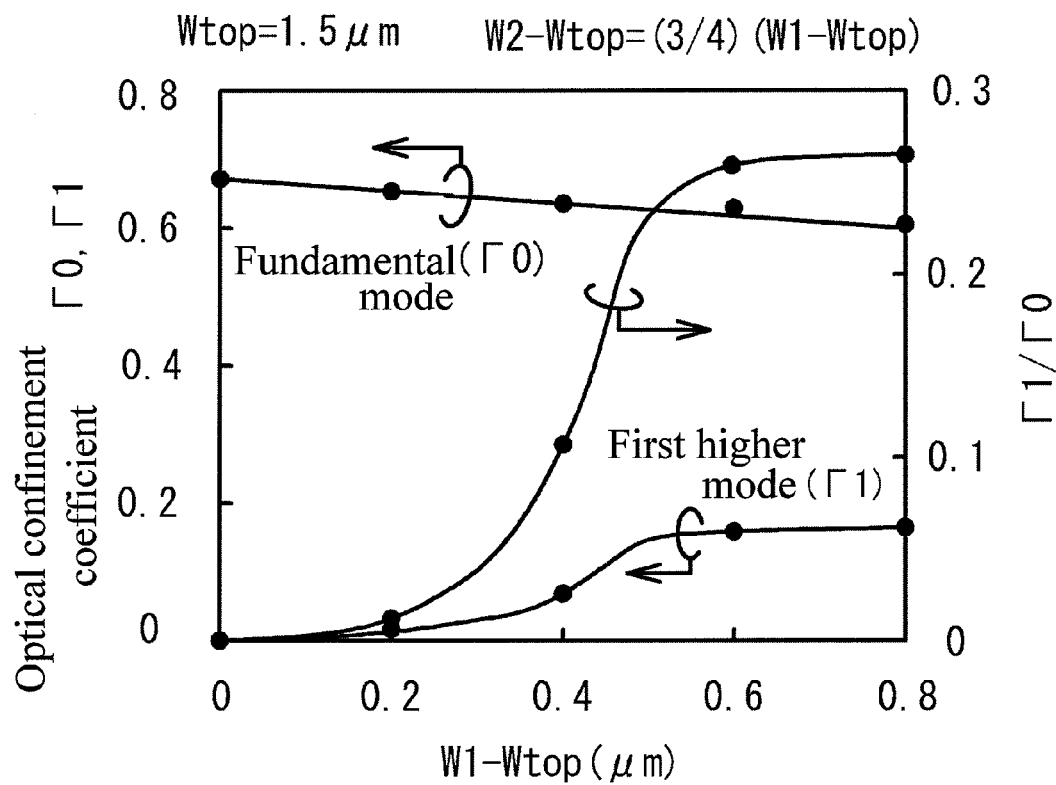
FIG. 9 is a graph showing simulation results of optical confinement factors when a value of W1−Wtop was varied in the semiconductor laser of FIG. 5.

FIG. 9 is a graph showing the simulation results of the optical confinement factor Γ0 of the fundamental mode M0, the optical confinement factor Γ1 of the first higher mode M1, and Γ1/Γ0 when a value of W1−Wtop was varied in the semiconductor laser of Comparative Example 1 shown in FIG. 5. Here, Wtop=1.5 μm and W2−Wtop=(¾)(W1−Wtop). The filled circles represent the simulation results, the solid lines are approximation lines connecting the simulation results. The optical confinement factor Γ0 of the fundamental mode M0 was about 0.67 when W1−Wtop=0. The optical confinement factor Γ0 of the fundamental mode M0 slightly decreased along with increase of W1−Wtop and was about 0.6 when W1−Wtop=0.8 μm. Meanwhile, the optical confinement factor Γ1 of the first higher mode M1 was almost zero when W1−Wtop=0. However, the optical confinement factor Γ1 of the first higher mode M1 drastically increased when W1−Wtop=0.2 μm to 0.6 μm, and was saturated when W1−Wtop exceeded 0.6 μm.

Referring to FIG. 9, when W1≦Wtop+0.4 μm, the optical confinement factor Γ1 of the first higher mode M1 can be lower than Γ1 of the case where W1>Wtop+0.6 μm. Therefore, higher modes in the region R can be suppressed, and the intensity of the fundamental mode in the region R can be increased. Furthermore, when W1≦Wtop+0.2 μm, Γ1 can be made almost zero.

Figure 10:
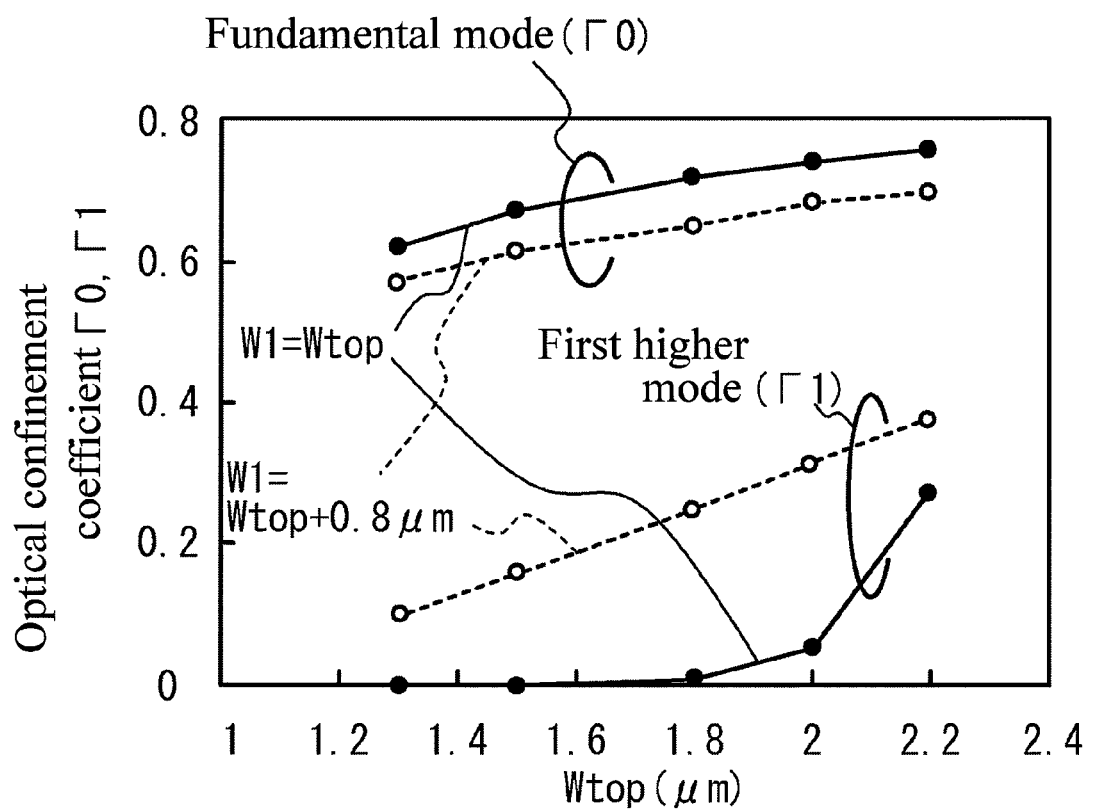
FIG. 10 is a graph showing optical confinement factors when Wtop was varied in the semiconductor laser of FIG. 5.

FIG. 10 is a graph showing the optical confinement factor Γ0 of the fundamental mode M0 and the optical confinement factor Γ1 of the first higher mode M1 when Wtop was varied. The filled circles and the open circles represent the simulation results of a case where W1=Wtop and a case where W1=Wtop+0.8 μm, respectively. The solid lines and the dashed lines are lines connecting the simulation results. In the case where W1=Wtop, Γ1 drastically decreased when Wtop=2.0 μm, became almost zero when Wtop=1.8 μm, and became zero when Wtop=1.6 μm. Meanwhile, in the case where W1=Wtop+0.8 μm, Γ1 decreased as Wtop decreased. However, Γ1 did not drastically decrease unlike the case where W1=Wtop.

As described above, even if the width Wtop of the top of the ridge portion 30 is smaller than the width Wbot of the bottom of the ridge portion 30, configuration that W1≦Wtop+0.4 μm can suppress higher modes and can increase the intensity of the fundamental mode in the region R. Furthermore, in order to suppress higher modes, it is more preferable to use configuration that W1≦Wtop−0.2 μm. Moreover, it is more preferable to use configuration that W2≦Wtop+0.3 μm. It is still more preferable to use configuration that W2≦Wtop+0.15 μm. Furthermore, referring to FIG. 10, Wtop is preferably set to be equal to or less than 2.0 μm, more preferably equal to or less than 1.8 μm, and still more preferably equal to or less than 1.6 μm.

EXAMPLE 3

Figure 11:
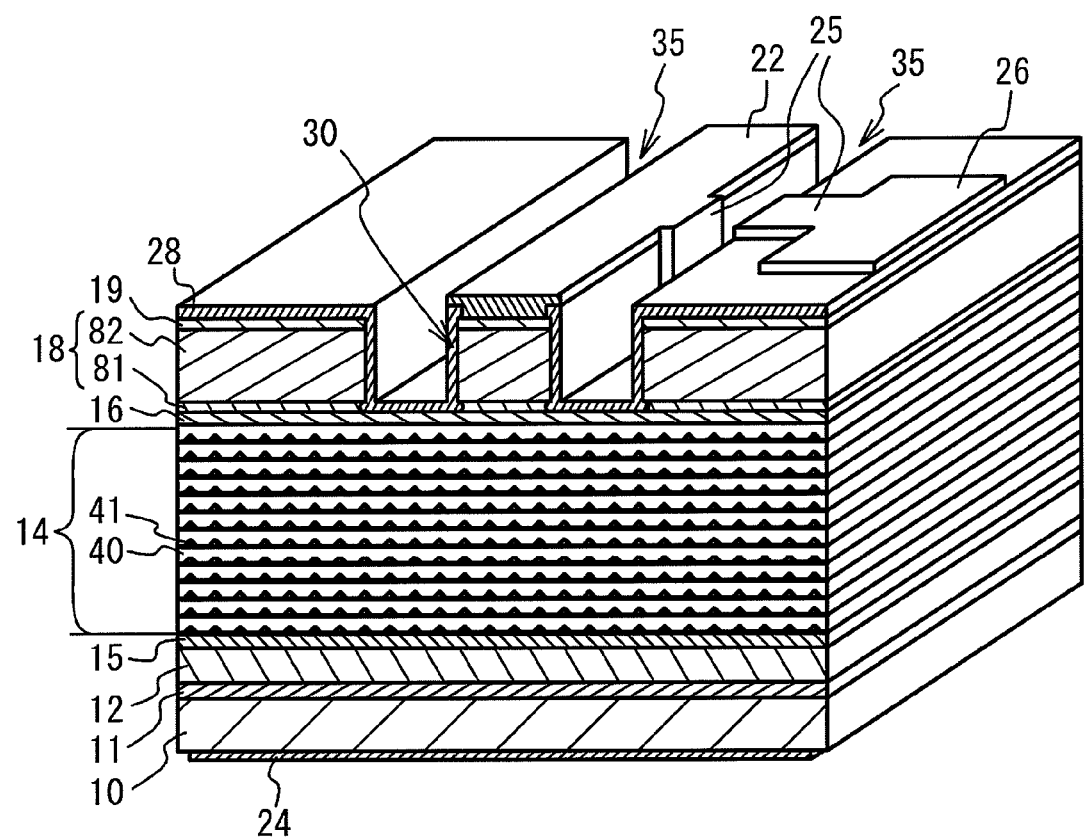
FIG. 11 is a cross-sectional perspective view of a semiconductor laser according to Example 3.

Example 3 is an example of production of a semiconductor laser. FIG. 11 is a cross-sectional perspective view of Example 3. A buffer layer 11 of p-type GaAs, a p-type clad layer 12 of p-type AlGaAs, a spacer layer 15 of undoped GaAs, a quantum dot active layer 14 in which a plurality of layers of quantum dots (12 layers in FIG. 11) were stacked, a spacer layer 16 of undoped GaAs, a first layer 81 and a second layer 82 of n-type AlGaAs, and a contact layer 19 (third layer) of n-type GaAs were sequentially stacked on a p-type GaAs substrate 10. Table 1 shows the material, the film thickness, and the doping concentration of each layer.

TABLE 1

| Layer name | Material | Film thickness (nm) | Doping concentration (/cm³) |
|---|---|---|---|
| Contact layer | n-GaAs | 600 | $5 \times 10^{18}$ |
| N-type clad layer | n-$Al_{0.35}Ga_{0.65}As$ | 860 | $1 \times 10^{18}$ |
|  | n-$Al_{0.45}Ga_{0.55}As$ | 200 | $5 \times 10^{17}$ |
| Active layer | — | — | — |
| Spacer layer | GaAs | 33 | Undoped |
| P-type clad layer | p-$Al_{0.35}Ga_{0.65}As$ | 500 | $5 \times 10^{17}$ |
|  | p-$Al_{0.35}Ga_{0.65}As$ | 900 | $2 \times 10^{18}$ |
| Buffer layer | p-GaAs | 500 | $7 \times 10^{18}$ |
| Substrate | p-GaAs | — | — |

The n-type clad layer 18 and the contact layer 19 formed a ridge portion 30. The ridge portion 30 had a structure in which Wtop=1.7 μm and W3=1.45 μm. Recessed portions 35 that reached the spacer layer 16 were formed on both sides of the ridge portion 30. A silicon oxide film was formed as a protective film 28 on the contact layer 19 and surfaces of the recessed portions 35. An n-electrode 22 was formed on the contact layer 19 of the ridge portion 30. A pad 26 connecting to the n-electrode 22 via an interconnection 25 was formed. A p-electrode 24 was formed on a lower surface of the substrate 10.

Figure 12:
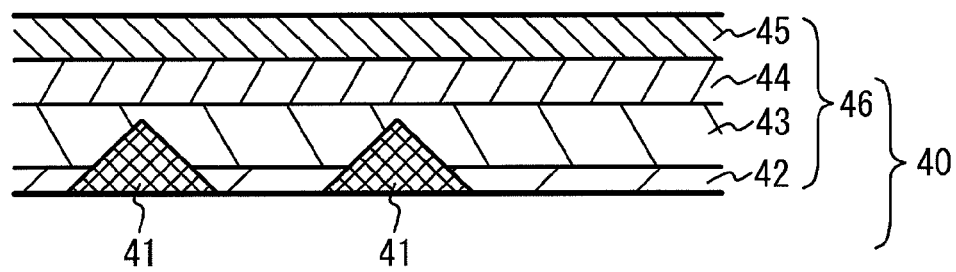
FIG. 12 is a diagram showing a dot layer as one layer of the quantum dot active layer.

FIG. 12 is a diagram showing a dot layer 40 as one layer of the quantum dot active layer. The quantum dots 41 are formed of InAs. An InGaAs layer 42 having a film thickness of about 5 nm is formed between the quantum dots 41. An undoped GaAs layer 43 having a film thickness of about 14 nm is formed so as to cover the quantum dots 41 and the InGaAs layer 42. A p-type GaAs layer 44 having a film thickness of about 10 nm and an undoped GaAs layer 45 having a film thickness of 9 nm are formed on the undoped GaAs layer 43. The undoped GaAs layer 43, the p-type GaAs layer 44, and the undoped GaAs layer 45 form a barrier layer 46. Table 2 shows the material, the film thickness, and the doping concentration of each layer in the quantum dot active layer 14.

TABLE 2

| Layer name | Material | Film thickness (nm) | Doping concentration (/cm³) |
|---|---|---|---|
| Undoped GaAs layer | GaAs | 9 | Undoped |
| P-type GaAs layer | p-GaAs | 10 | $5 \times 10^{17}$ |
| Undoped GaAs layer | GaAs | 14 | Undoped |
| InGaAs layer | $In_{0.15}Ga_{0.85}As$ | 5 | Undoped |

Figure 13:
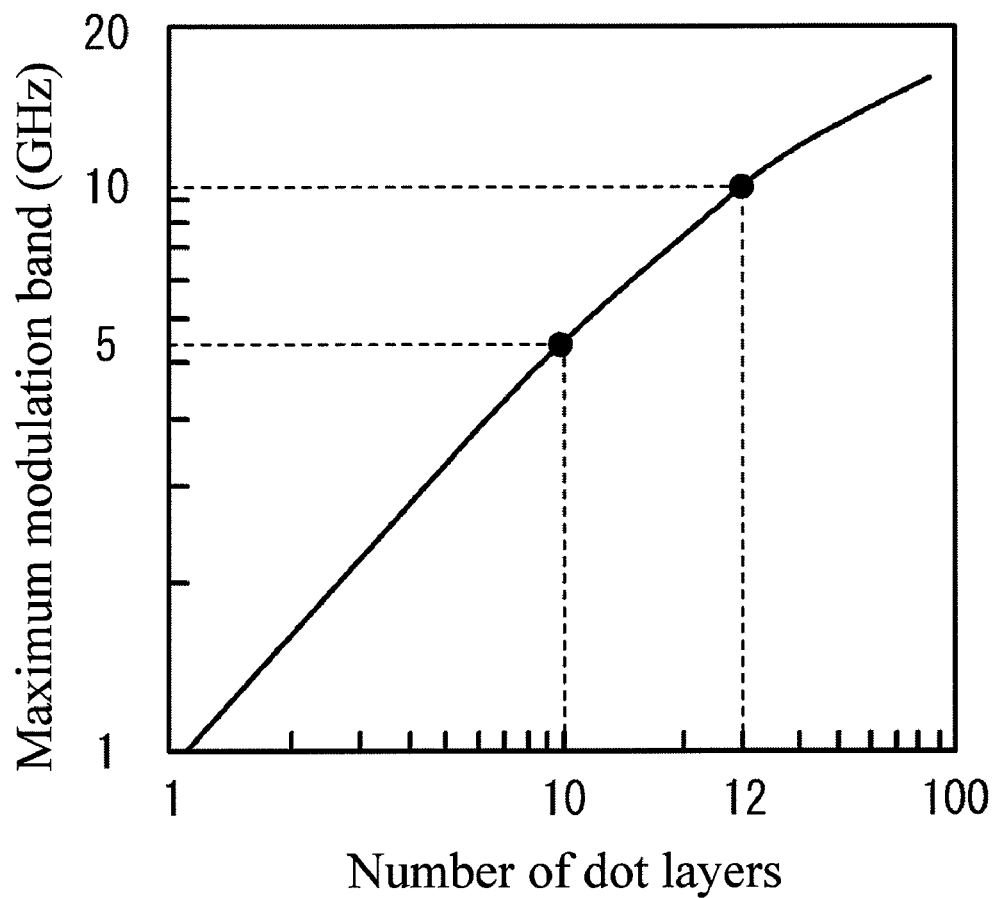
FIG. 13 is a graph showing the maximum modulation band of a semiconductor laser with respect to the number of dot layers.

FIG. 13 is a graph showing the maximum modulation band of a semiconductor laser with respect to the number of dot layers. The filled circles of FIG. 13 represent maximum modulation bands of semiconductor lasers produced as a trial in which the number of the dot layers 40 was 10 layers and 12 layers. The solid line represents the simulation results. The maximum modulation band increased as the number of the dot layers 40 increased.

In Example 3, the maximum modulation band could be increased to at least 10 GHz by providing 12 or more dot layers 40 as shown in FIG. 13. The contact layer 19 (third layer) was provided on the second layer 82. The n-type carrier concentration of the contact layer 19 was higher than those of the first layer 81 and the second layer 82. Thus, a contact resistance between the n-electrode 22 and the n-type clad layer 18 could be reduced.

In FIG. 12, a plurality of quantum dots 41 is formed of InAs. However, the quantum dots 41 should only have a band gap smaller than the barrier layer 46. The barrier layer 46 surrounding a plurality of quantum dots 41 in the quantum dot active layer 14 is formed of GaAs and InGaAs. For example, however, the barrier layer 46 may be formed of AlGaAs.

When the first conductive type is p-type and the second conductive type is n-type as in Example 3, the n-type clad layer 18 has a ridge structure in order to reduce an area of p-n junction in many cases where the barrier layer 46 includes a p-type layer. At that time, it is effective to apply the present invention in order to suppress higher modes. It is preferable to form the p-type layer within 30 nm from the quantum dots 41.

It is preferable to provide the undoped spacer layer 16 between the quantum dot active layer 14 and the n-type clad layer 18 as shown in FIG. 11. With this configuration, the quantum dot active layer 14 can be prevented from being over-etched when the ridge portion 30 is formed. It is preferable for the spacer layer 16 to have a film thickness of at least 50 nm in order to protect the quantum dot active layer 14. Furthermore, the area of the pad 26 is preferably equal to or smaller than 40000 μm².

Although preferred examples of the present invention have been described in detail, the present invention is not limited to those specific examples. It should be understood that various changes and modifications may be made within the scope of the present invention recited in the claims.

The invention claimed is:

1. A semiconductor laser comprising:
    a first conductive type of a lower clad layer;
    an active layer provided on the lower clad layer, active layer including a plurality of quantum dots;
    a second conductive type of an upper clad layer that is opposite to the first conductive type, the upper clad layer being provided on the active layer so as to have an isolated ridge portion such that $W1 \leq Wtop + 0.4 \ \mu m$ where Wtop is a width of a top of the ridge portion and W1 is a width of the ridge portion at a height of 20 nm from a bottom of the upper clad layer; and
    an electrode provided on the upper clad layer,
    wherein the upper clad layer includes a first and a second layer provided on the first layer, the first layer being at a bottom layer of the upper clad layer,
    the first layer has a minimum width of the ridge portion, and
    the second layer has a side surface that was subjected to anisotropic etching.

2. The semiconductor laser as recited in claim 1, wherein:
    the first layer and the second layer comprise an AlGaAs layer, and
    an Al compositional ratio of the first layer is higher than that of the second layer.

3. The semiconductor laser as recited in claim 1, comprising a third layer provided on the second layer, the third layer having a concentration of the second conductive type of carriers that is higher than those of the first layer and the second layer.

4. The semiconductor laser as recited in claim 1, wherein:
    the plurality of quantum dots is formed of InGaAs or InAs, and
    the active layer includes a barrier layer of AlGaAs or GaAs that surrounds the plurality of quantum dots.

5. The semiconductor laser as recited in claim 4, wherein:
    the first conductive type is p-type, and the second conductive type is n-type, and
    the barrier layer has a p-type layer.

6. The semiconductor laser as recited in claim 1, comprising an undoped layer between the active layer and the upper clad layer.

7. The semiconductor laser as recited in claim 1, wherein:
    the Wtop is equal to or less than 2.0 μm.

8. The semiconductor laser as recited in claim 1, wherein:
    the side surface of the second layer is perpendicular.

* * * * *